US008068540B2

(12) United States Patent
De Jong et al.

(10) Patent No.: US 8,068,540 B2
(45) Date of Patent: Nov. 29, 2011

(54) CARTESIAN MODULATION SYSTEM VIA MULTI-LEVEL PULSE WIDTH MODULATION

(75) Inventors: Gerben De Jong, Veldhoven (NL); Jan Vromans, Maastricht (NL)

(73) Assignee: NXP B.V., Eindhoven (NL)

( * ) Notice: Subject to any disclaimer, the term of this patent is extended or adjusted under 35 U.S.C. 154(b) by 753 days.

(21) Appl. No.: 12/161,926

(22) PCT Filed: Jan. 18, 2007

(86) PCT No.: PCT/IB2007/050175
§ 371 (c)(1),
(2), (4) Date: Jul. 23, 2008

(87) PCT Pub. No.: WO2007/083281
PCT Pub. Date: Jul. 26, 2007

(65) Prior Publication Data
US 2009/0021320 A1    Jan. 22, 2009

(30) Foreign Application Priority Data

Jan. 23, 2006    (EP) .................................... 06100713

(51) Int. Cl.
*H03K 7/08* (2006.01)
(52) U.S. Cl. ...................................................... 375/238
(58) Field of Classification Search .................. 375/238; 332/109
See application file for complete search history.

(56) References Cited

U.S. PATENT DOCUMENTS

2005/0231410 A1\* 10/2005 Lee ................................ 341/144
2010/0097153 A1\* 4/2010 Rexberg et al. ............... 332/109

FOREIGN PATENT DOCUMENTS
WO    02009381 A    1/2002

OTHER PUBLICATIONS

Midya Pallab et al: "Quadrature Integral Noise Shaping for Generation of Modulated RF Signals", Database Compendix [Online], Engineering Information Inc., New York, NY, USA; Database Accession No. E2003177449526 Abstract, Midwest Symp Circuits Syst; Midwest Symposium on Circuits and Systems 2002, vol. 2, 2002, p. II537-II540.

\* cited by examiner

*Primary Examiner* — Don N Vo

(57) ABSTRACT

A system and method for Cartesian modulation achieved via generation of a three-level pulse width modulated signal. The system in overview comprises two binary pulse width modulated signal generators receiving signals related to the in-phase and quadrature components of a base-band signal and a combination and amplification stage that combines the signals provided by the two binary pulse width modulated signal generators. The binary pulse width modulated signal generators contain at least one signal comparator and at least one base-band pre-distortion element. The signals related to the in-phase and quadrature components of the base-band signal may be; the positive or negative parts of the in-phase component, the positive or negative parts of the quadrature component, the absolute value or sign of the in-phase component, or the absolute value or sign of the quadrature component. These signals may be distorted by a base-band pre-distortion element before being coupled to the comparators.

18 Claims, 7 Drawing Sheets

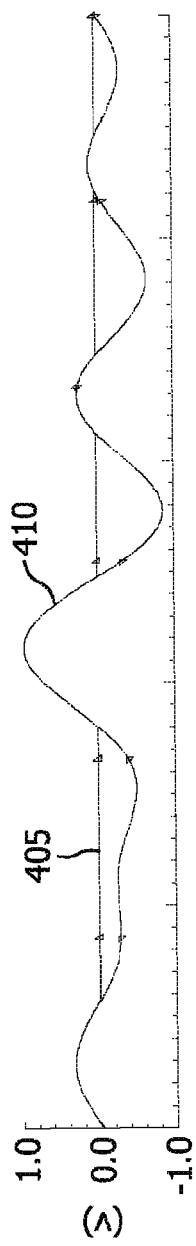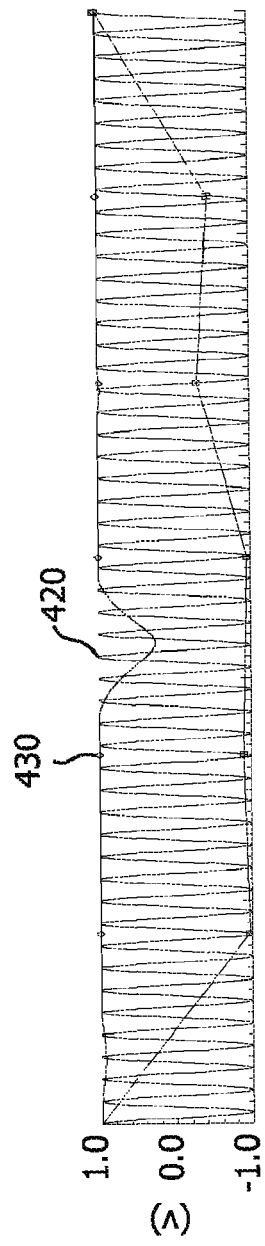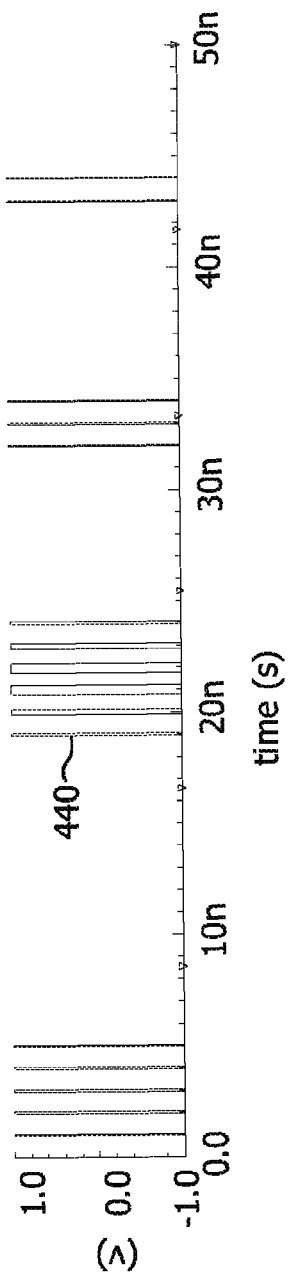

CARTESIAN MODULATION SYSTEM VIA MULTI-LEVEL PULSE WIDTH MODULATION

This application claims priority from EP application No. 06100713.4 filed Jan. 23, 2006 and PCT/IB2007/050175 filed Jan. 8, 2007.

The present invention relates to Cartesian modulation systems, in particular the invention relates to Cartesian modulation systems wherein Cartesian modulation is achieved via generation of a multi-level pulse width modulated signal. The invention further relates to a method for producing Cartesian modulation.

Cartesian modulation is a method used in the implementation of wireless radio-communication transceivers. Cartesian or quadrature modulation systems are based on the principle of modulating directly the RF carrier by means of the In-phase, I, and Quadrature, Q, scalar components of the base-band signal.

A conventional implementation of a Cartesian modulation system is shown in FIG. 1. The Cartesian modulator 120 contains a local quadrature RF-oscillator 130, a first multiplier 140, a second multiplier 150 and a combiner 160. Furthermore the Cartesian modulation system will typically contain a power amplifier 170 and a band-pass filter 180. An in-phase scalar component 105 of a base-band signal is up-mixed with an in-phase RF-signal 134 originated in the local quadrature RF-oscillator 130. A quadrature component 110 of the base signal is up-mixed with a quadrature RF-signal 138 originated in the local quadrature RF-oscillator 130. The up-mixed in-phase component of the base-band signal and the up-mixed quadrature component of the base-band signal are combined in an adder 160 providing the final modulated signal. Typically the modulated signal will then be amplified by the power amplifier 170 in order to provide the required output power for transmission and filtered in a band-pass filter 180 in order to reduce the spectral content and avoid spectral interference.

Cartesian modulators implemented following a traditional structure imply a series of strict requirements in their design. Both up-mixers need to be double balanced, since the in-phase and quadrature components of the base-band signal as well as the local oscillator signals are bipolar signals. Furthermore a double balanced mixer requires the suppression of the base-band signal and the local oscillator signal at its output. Both double balanced mixers have to ensure a high linearity in the in-phase and quadrature components of the base-band signal in order to avoid appearance of any unwanted frequency components. It is an additional requirement that the power amplifier should also be a very linear device in order to avoid any spectral re-growth that might broaden the signal spectrum over the strict limits imposed typically in the spectral transmission masks defined within wireless transmission standards, e.g. CDMA, TDMA, GSM or GPRS.

The present invention seeks to provide an improved system that enables Cartesian modulation in an effective way, wherein the switching frequency of the power amplifier equals the RF-carrier frequency requiring no over-sampling. Preferably, the invention alleviates, mitigates or eliminates one or more of the above or other disadvantages singly or in any combination.

In the context of this application it is considered a slowly varying complex base-band signal, in relation to the carrier RF-frequency. The in-phase component of the complex base-band signal is obtained by projection of the complex base-band signal on a traditional x-axis while the quadrature component of the complex base-band signal is obtained by projection of the complex base-band signal on a traditional y-axis. Due to the slowly varying nature of the complex base-band signal, the in-phase and quadrature components may have positive or negative values over time. Therefore it is possible to define a positive part of the in-phase component of the base-band signal, a negative part of the in-phase component of the base-band signal, a positive part of the quadrature component of the base-band signal and a negative part of the quadrature component of the base-band signal.

Accordingly it is provided, in a first aspect, a Cartesian modulation system for producing an RF output signal, containing an RF carrier and modulated by a base-band signal, the system comprising:
- a first binary pulse width modulated signal generator coupled to receive signals related to the in-phase component of a base-band signal, comprising at least one base-band pre-distortion element and at least one signal comparator, and producing a first binary pulse width modulated signal carrying the in-phase information of the base-band signal;
- a second binary pulse width modulated signal generator coupled to receive signals related to the quadrature component of a base-band signal, comprising at least one base-band pre-distortion element and at least one signal comparator, and producing a second binary pulse width modulated signal carrying the quadrature information of the base-band signal; and
- a combination and amplification stage that combines the first binary pulse width modulated signal and second binary pulse width modulated signal and is adapted to provide an amplified three-level pulse width modulated radio frequency signal carrying the in-phase and quadrature components of the base-band signal.

The base-band pre-distortion element may include one or more pre-distortion blocks wherein each of the blocks may map signals related to the in phase or quadrature components of the base-band signal to specific requirements of the RF output signal, e.g. modifications on the duty cycle or modifications on the comparator-level used in the comparators. The switching frequencies at the comparator outputs equal the frequency of the RF output signal typically locked to one reference RF-oscillator. The combination and amplification stage is able to combine the first and second pulse width modulated signals in a way that a three-level pulse width modulated radio frequency signal is generated carrying the amplitude and the phase of the base-band signal. The combination and amplification stage is furthermore able to provide the three-level pulse width modulated signal with the power level required to ensure a correct transmission of the modulated signal according to the specific applications, e.g. different power levels may be required if the modulator should be used in a wireless LAN, a BlueTooth application, or a wireless mobile application.

The invention is particularly but not exclusively advantageous for a number of reasons. There is no need of using double balanced up-mixers, therefore the linearity requirements for the elements that comprise the system, e.g. power amplifier, is relaxed, avoiding spectral re-growth in the elements. Furthermore the switching frequency at each of the comparator outputs equals the frequency of the RF output signal avoiding any requirement for over-sampling at the comparators. The RF-oscillator generates a sinusoidal output signal and therefore the requirement for more complex signals, e.g. highly linear triangular signal, saw tooth signal, is avoided.

In an embodiment of the invention, the first binary pulse width modulated signal generator comprises a first and a second pre-distortion element coupled to receive a signal related to the positive and negative part respectively of the in-phase component of the base-band signal. Furthermore the first binary pulse width modulated signal generator comprises a first and a second comparator. By treating separately the positive and negative parts of the in-phase component of the base-band signal most components of the first binary pulse width modulated signal generator may be single balanced as there is no need of treating bi-polar signals.

In another embodiment of the invention, the first binary pulse width modulated signal generator comprises a pre-distortion element coupled to receive a signal related to the absolute value of the in-phase component of the base-band signal. Furthermore the first binary pulse width modulated signal generator comprises a comparator signal and logical unit that allows flipping of the phase of the first harmonic of the comparator signal according to the sign of the in-phase component of the base-band signal. This implementation is advantageous because it minimizes the number of pre-distortion elements, comparators and local oscillator related signals needed in the implementation of the first binary pulse width modulated signal generator.

In an embodiment of the invention, the second binary pulse width modulated signal generator comprises a first and a second pre-distortion element coupled to receive a signal related to the positive and negative part respectively of the quadrature component of the base-band signal. Furthermore the second binary pulse width modulated signal generator comprises a first and a second comparator. By treating separately the positive and negative parts of the quadrature component of the base-band signal most components of the second binary pulse width modulated signal generator may be single balanced as there is no need of treating bi-polar signals.

In another embodiment of the invention, the second binary pulse width modulated signal generator as defined in claim 5 comprises a pre-distortion element coupled to receive a signal related to the absolute value of the quadrature component of the base-band signal. Furthermore the second binary pulse width modulated signal generator as defined in claim 3 comprises a comparator signal and logical unit that allows flipping of the phase of the first harmonic of the comparator signal according to the sign of the quadrature component of the base-band signal. The implementation according to claim 5 is advantageous as it minimizes the number of pre-distortion elements, comparators and local oscillator related signals needed in the implementation of the second binary pulse width modulated signal generator.

In an embodiment of the invention, the combination and amplification stage comprises a single power amplifier containing a decoder and a three-level switching output stage, this implementation is specifically designed for a three-level application and minimizes the number of amplifiers required. The switching character of the output stage leads to a low power dissipation in this output stage and therefore to a high efficiency.

In another embodiment of the invention, the combination and amplification stage as defined in claim 11 comprises a plurality of power amplifiers, a plurality of quarter-lambda transmission lines and a combiner, this implementation is specifically designed for the use of on-the-shelf components. In this case each power-amplifier only has to process a binary signal leading to a less complex implementation compared to the three-level power-amplifier.

In yet another embodiment of the invention, it is provided a band-pass filter filtering stage, the band-pass filtering stage providing a filtered version of the amplified pulse width modulated signal for reducing its harmonic content thereby suppressing unwanted frequency components which otherwise might disturb other radio systems. Furthermore, the band-pass filtering stage may provide a filtered version of the amplified pulse width modulated signal suppressing significantly the higher harmonics suppressing significantly the higher harmonics and low frequency spurious.

In an embodiment of the invention, the fundamental frequencies of the three-level pulse width modulated radio frequency signal contain the RF-carrier frequency. This implies that no over-sampling and neither sub-sampling is applied.

In another embodiment of the invention, the fundamental frequencies of the three-level pulse width modulated radio frequency signal are other than the RF-carrier frequency. The fundamental frequencies may be frequencies below or above the RF-carrier frequency providing tunability by control of the pre-distortion elements. This situation corresponds to sub-sampling or over-sampling respectively. Sub-sampling is advantageous because in that case the switching frequency of the combination and amplification stage is chosen to be lower than the RF-carrier frequency leading to an easier implementation and a higher efficiency.

In an embodiment of the invention, transmitter comprising a modulation system according to the invention is provided. Using the Cartesian modulation system described in the present invention allows for the transmitter to adapt to different standards, as needed e.g. CDMA, TDMA, GSM or GPRS. Furthermore, the high efficiency of the polar modulation system described in present invention is advantageous for increasing battery lifetime in portable applications.

In a second aspect of the invention is provided a method for generating an RF output signal, containing an RF carrier and modulated by a base-band signal, comprising the steps of:

producing a first binary pulse width modulated signal carrying the in-phase information of the base-band signal, based on at least a first base-band pre-distortion element and signals related to the in-phase component of a base-band signal.

producing a second binary pulse width modulated signal carrying the quadrature information of the base-band signal, based on at least a second base-band pre-distortion element and signals related to the quadrature component of a base-band signal.

combining the first binary pulse width modulated radio frequency signal and the second binary pulse width modulated radio frequency signal in order to provide an amplified three-level pulse width modulated radio frequency signal carrying the in-phase and quadrature components of the base-band signal.

The present invention will be now explained, by the way of example only, with reference to the accompanying Figures wherein.

The present invention provides Cartesian modulation systems wherein Cartesian modulation is achieved via generation of a multi-level pulse width modulated signal and wherein the multi-level pulse width modulated signal is generated by comparing reference RF signals with pre-distorted signals related to the In-phase and Quadrature components of the base-band signal.

Figure 1:
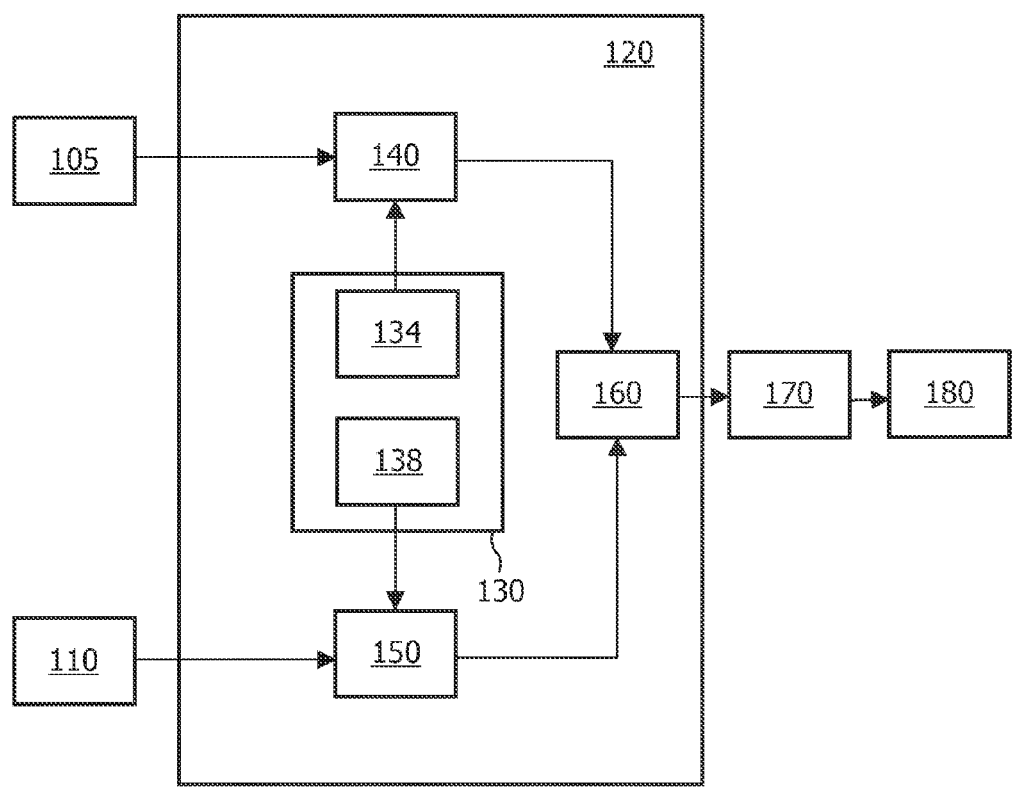
FIG. 1 is a block diagram illustrating the elements of a conventional Cartesian modulation system.
Figure 2:
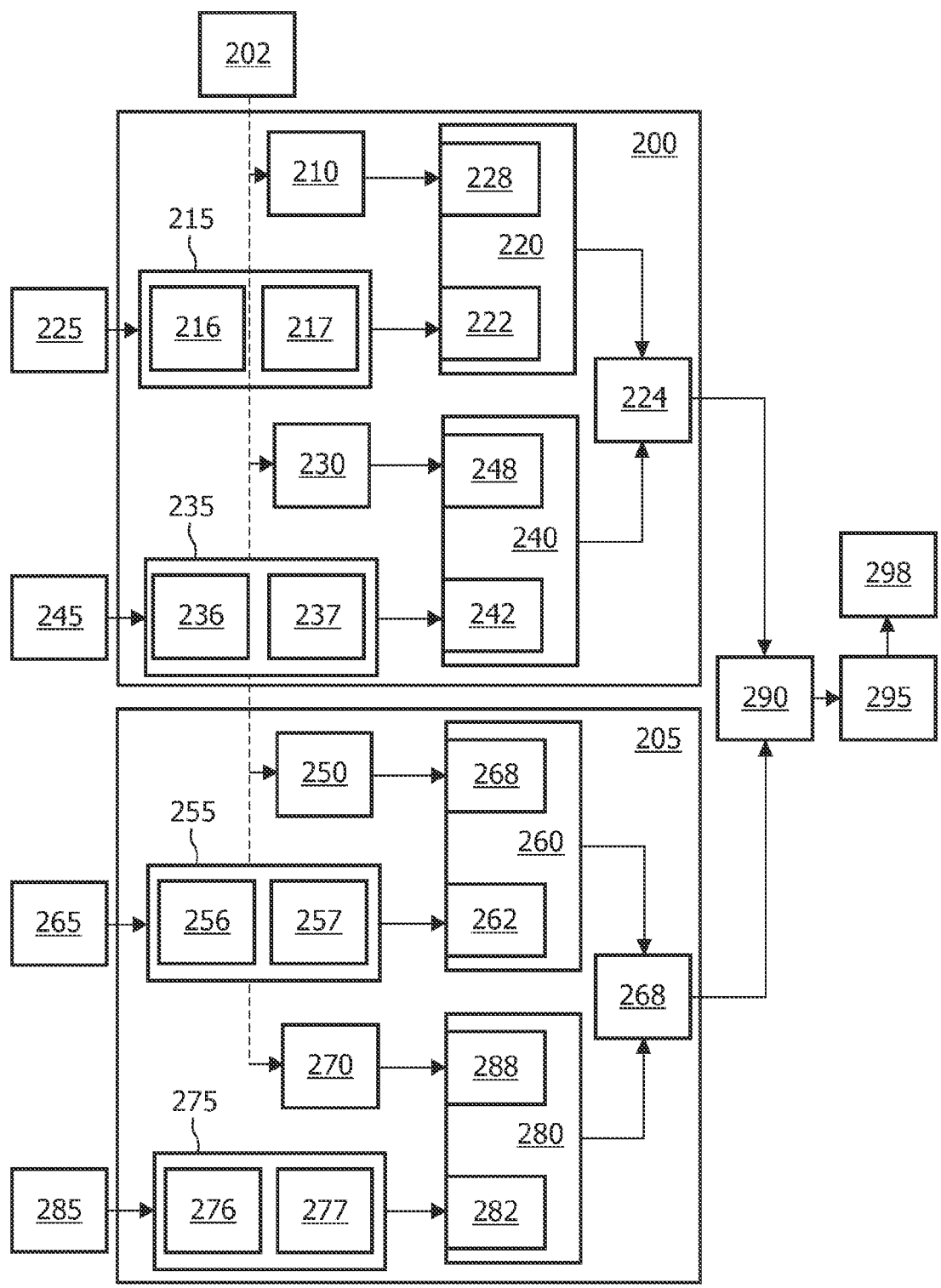
FIG. 2 is a detailed diagram illustrating the elements of a Cartesian modulation system for producing an RF output signal modulated by a base-band signal according to one embodiment of the invention.

A block diagram illustrating elements required in a system for achieving Cartesian modulation via generation of a multi-level pulse width modulated signal is shown in FIG. 2 according to one embodiment of the invention. A system for achieving Cartesian modulation via generation of a multi-level pulse width modulated signal comprises a RF-local oscillator 202, a first binary pulse width modulated signal generator 200, a second binary pulse width modulated signal generator 205, a combination and amplification stage 290, a band-pass filter 295 and an antenna 298. The first binary pulse width modulated signal generator 200 comprises a first 215 and a second 235 base-band pre-distortion elements, a first 220 and a second 240 comparators and a first combiner 224. The second binary pulse width modulated signal generator 205 comprises a third 255 and fourth 275 base-band pre-distortion elements, a third 260 and fourth 280 comparators and a second combiner 268. The RF-local oscillator provides a zero-degree phase shifted RF sinusoidal signal 210 and a 180-degree phase shifted RF sinusoidal signal 230 to the first pulse width modulated signal generator 200. Furthermore the RF-local oscillator provides a 90-degree phase shifted RF sinusoidal signal 250 and a 270-degree phase shifted RF sinusoidal signal 270 to the second pulse width modulated signal generator 205.

The first base-band pre-distortion element 215 receives a signal 225 representing the positive part of the in-phase component of a base-band signal and provides a first pre-distorted signal, which is an altered version of the positive part of the in-phase component of the base-band signal, to the negative input 222 of the first comparator 220. The zero-degree phase shifted RF sinusoidal signal 210 is input to the positive input 228 of the first comparator 220. The second base-band pre-distortion element 235 receives a signal 245 representing the negative part of the in-phase component of the base-band signal and provides a second pre-distorted signal, which is an altered version of the negative part of the in-phase component of the base-band signal, to the negative input 242 of the second comparator 240. The 180-degree phase shifted RF sinusoidal signal 230 is input to the positive input 248 of the second comparator 240. The first comparator 220 provides a first comparator signal to the first combiner 224 and the second comparator 240 provides a second comparator signal to first combiner 224. A first binary pulse width modulated signal is obtained from the first combiner 224. The third base-band pre-distortion element 255 receives a signal 265 representing the positive part of the quadrature component of the base-band signal and provides a third pre-distorted signal, which is an altered version of the positive part of the quadrature component of the base-band signal, to the negative input 262 of the third comparator 260. The 90-degree phase shifted RF sinusoidal signal 250 is input to the positive input 268 of the third comparator 260. The fourth base-band pre-distortion element 275 receives a signal 285 representing the negative part of the quadrature component of the base-band signal and provides a fourth pre-distorted signal, which is an altered version of the negative part of the quadrature component of the base-band signal, to the negative input 282 of the fourth comparator 280. The 270-degree phase shifted RF sinusoidal signal 270 is input to the positive input 288 of the fourth comparator 280. The third comparator 260 provides a third comparator signal to the second combiner 268 and the fourth comparator 280 provides a fourth comparator signal to second combiner 268. A second binary pulse width modulated signal is obtained from the second combiner 268. The combination and amplification stage 290 provides an amplified three-level pulse width modulated signal combining the first and second pulse width modulated signals obtained at the output of the first 224 and second 268 combiners. The amplified three-level pulse width modulated signal is filtered at the band-pass filter 295 and the filtered signal is sent via an antenna 298. The band-pass filter may reduce the bandwidth of the pulse width modulated signal so that the RF signal at the output of the band-pass filter mainly contains its first harmonic and the corresponding sidebands, having significantly suppressed the higher harmonics and low frequency spurious of the amplified three-level pulse width modulated signal.

In alternative implementations of the embodiment described above the band-pass filter may also be included in the combination and amplification stage as an LC-tank. The combination and amplification stage, the band-pass filter and/or the antenna may be physically separated from the comparators and/or the base-band pre-distortion element. The base-band pre-distortion elements may be implemented in the analogue or in the digital domain.

Each of the base-band pre-distortion elements (215,235, 255,275) might comprise a plurality of pre-distortion blocks. In the embodiment presented above each of the base-band pre-distortion elements contained a first (216,236,256,276) pre-distortion block and a second (217,237,257,277) pre-distortion block. In this embodiment of the invention the first pre-distortion blocks (216,236,256,276) carry out the amplitude to duty cycle conversion while the second pre-distortion blocks (217,237,257,277) carry out the duty cycle to comparator level conversion.

Figure 3:
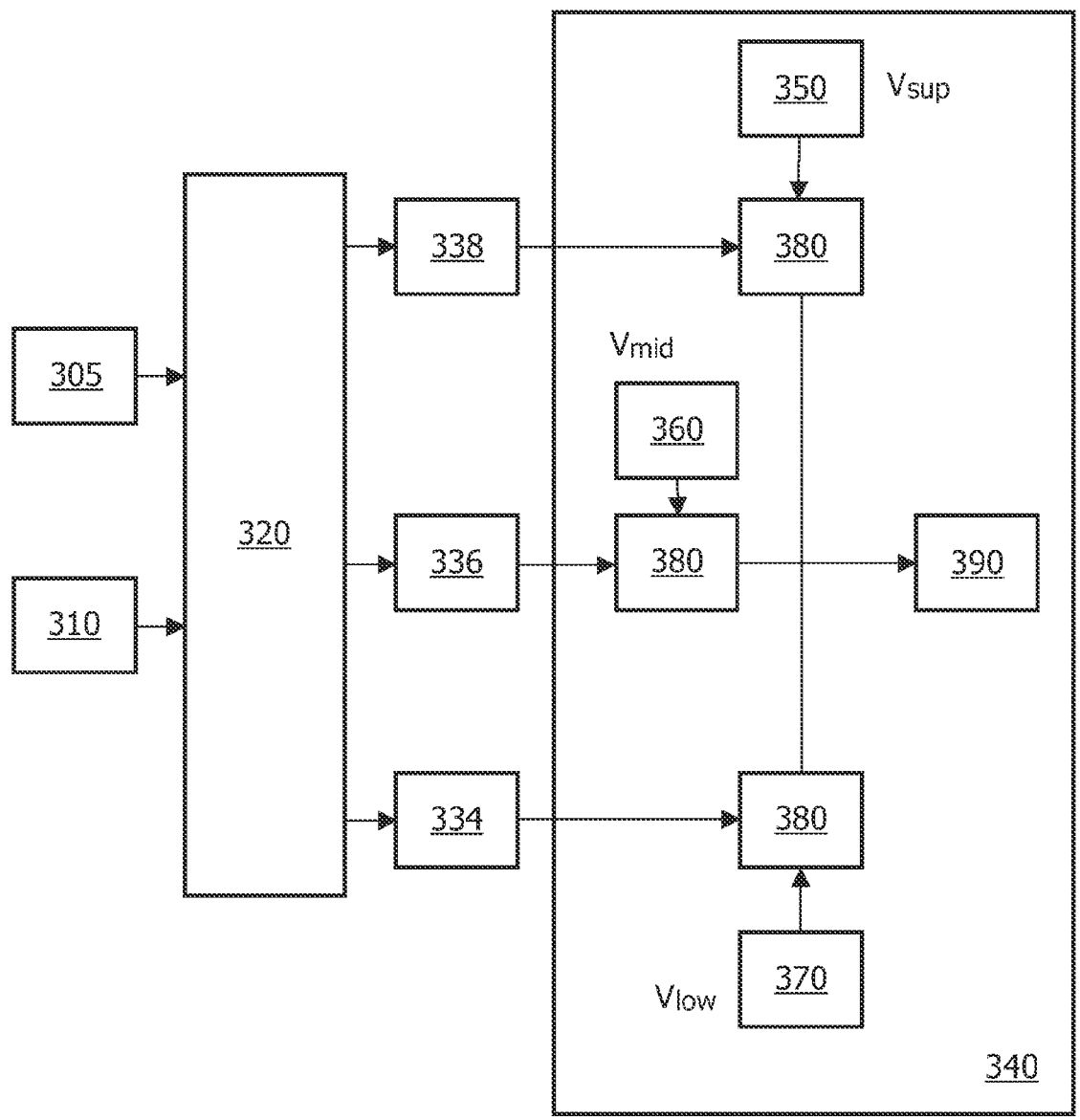
FIG. 3 is a block diagram illustrating the elements of a possible implementation of the combination and amplification stage containing a three-level switching output stage according to one possible embodiment of the invention.

In another embodiment of the invention the combination and amplification stage is based on a decoder and a three-state switching output stage. A block diagram illustrating the elements of a possible implementation of the combination and amplification stage containing a decoder 320 and a three-state switching output stage 340 is shown in FIG. 3. A first pulse width modulated signal 305, output from the first combiner 224, and a second pulse width modulated signal 310, output from the second combiner 268, are coupled to the input of the decoder 320. The decoder translates a "one" level from the first pulse width modulated signal to a "high level" signal 338 at the output of the decoder. The decoder translates a "zero" level from the first pulse width modulated signal and a "one" level from the second pulse width modulated signal to a "middle level" signal 336 at the output of the decoder. The decoder translates a "zero" level from the second pulse width modulated signal to a "low level" signal 334 at the output of the decoder. The three-state switching stage 340 contains a high-level power supply 350, Vsup, a middle-level power supply 360, Vmid, and a low-level power supply 370, Vlow. The three power supplies Vsup, Vmid and Vlow are related by equation (1), and in that the middle-level power supply 360, Vmid, has a voltage equal or approximately equal to half of the sum of the voltage of the high-level power supply 350, Vsup, and the voltage of the low-level power supply 370, Vlow. The three-state switching stage 340 furthermore contains three switches 380 controlled by the "high level" signal 338, "middle level" signal 336 and "low level" signal 334 and providing a three-level pulse width modulated signal with Vsup, Vmid or Vlow accordingly. The output signals from the three switches are combined in the output node 390 of the power amplifier providing the amplified three-level pulse width modulated signal.

$$V_{sup} > V_{mid} > V_{low} \tag{1}$$

Figure 6:
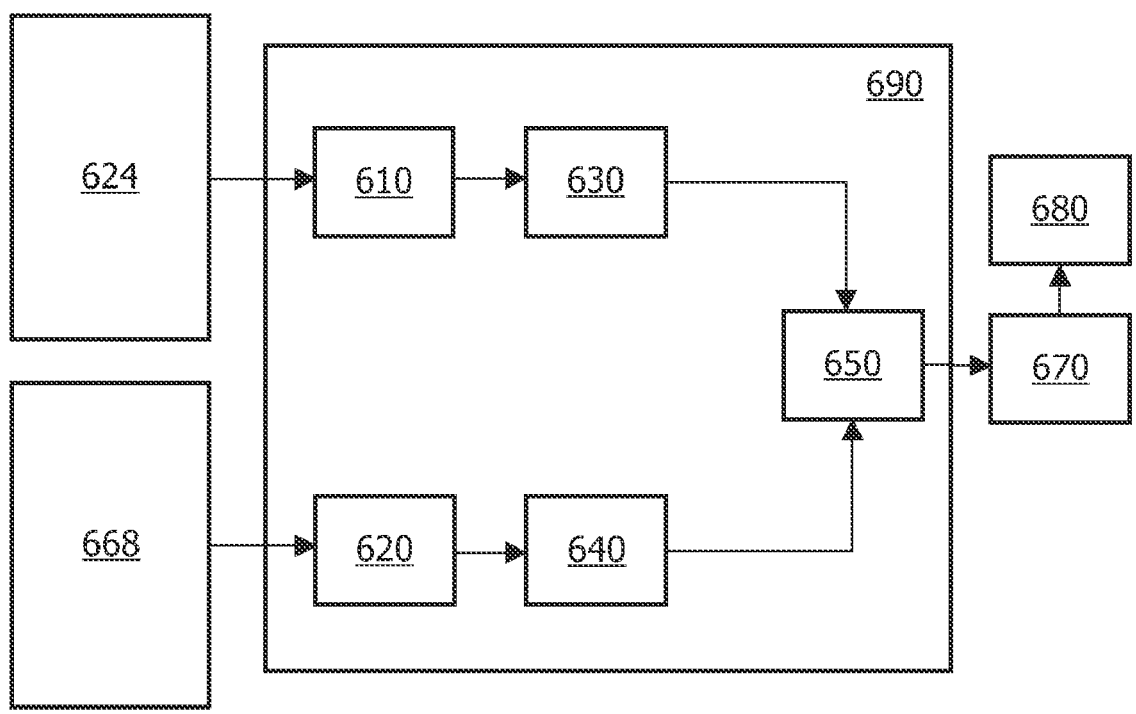
FIG. 6 is a block diagram illustrating the elements of an alternative implementation of the combination and amplification stage, based on multiple power amplifiers and quarter-lambda transmission lines, according to another possible embodiment of the invention.

In another embodiment of the invention the combination and amplification stage 290 is implemented comprising a plurality of power amplifiers, a plurality of quarter-lambda transmission lines and a combiner, a block diagram illustrating the elements of this alternative implementation of the combination and amplification stage is shown in FIG. 6. In this embodiment the first output binary pulse width modulated signal 624 from the first combiner 224 is amplified by a first power amplifier 610 providing a first amplified binary pulse width modulated signal. The second output binary pulse width modulated signal 668 from the second combiner 268 is amplified by a second power amplifier 620 providing a second amplified binary pulse width modulated signal. The first and second amplifiers typically present similar characteristics. In this embodiment the first and second power amplifiers have low-ohmic outputs, and first 630 and second 640 quarter-lambda transmission lines are used to transform the voltage-source characteristic of the first and second power-amplifier output into a current-source characteristic, allowing for a simple connection of the transmission-line outputs in parallel at a combiner 650.

Figure 5:
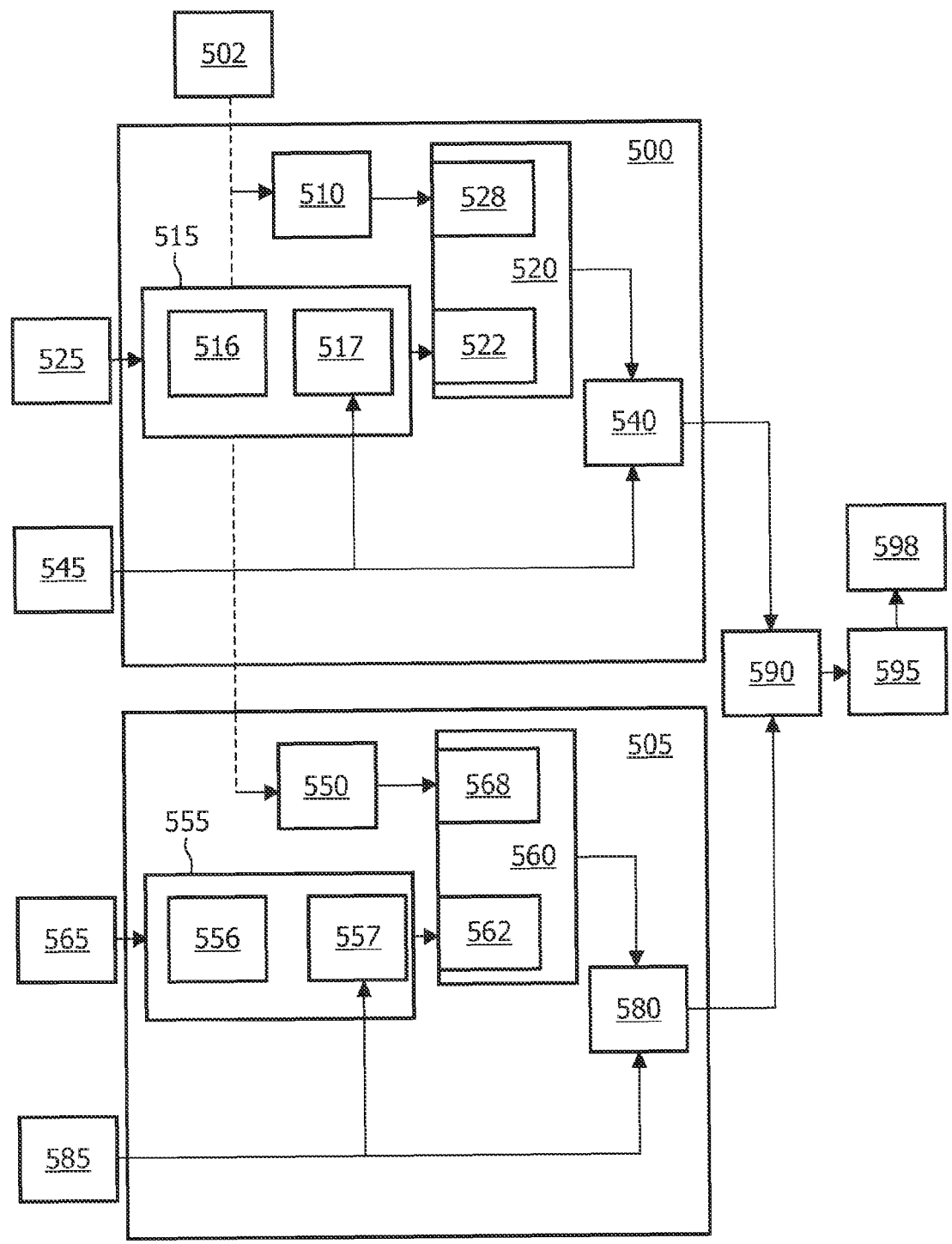
FIG. 5 is a detailed diagram illustrating the elements of a Cartesian modulation system for producing an RF output signal modulated by a base-band signal according to another embodiment of the invention.

In another embodiment of the invention the first and second binary pulse width modulated signal generators are based on the combined functionality of a comparator and an XOR logical unit. A block diagram illustrating elements required in a system for achieving Cartesian modulation via generation of a multi-level pulse width modulated signal based on the combined functionality of comparators and XOR logical units is shown in FIG. 5 according to one embodiment of the invention. A system for achieving Cartesian modulation implemented according to this embodiment comprises a RF-local oscillator 502, a first binary pulse width modulated signal generator 500, a second binary pulse width modulated signal generator 505, a combination and amplification stage 590, a band-pass filter 595 and an antenna 598. The combination and amplification stage 590, band-pass filter 595 and antenna 598 have the same characteristics as those described in the previous embodiments (290,295,298) and may be implemented in any of the ways described previously. The first binary pulse width modulated signal generator 500 comprises a first 515 base-band pre-distortion element, a first 520 comparator and a first XOR logical unit 540. The second binary pulse width modulated signal generator 505 comprises a second 555 base-band pre-distortion element, a second 560 comparator and a second XOR logical unit 580. The RF-local oscillator provides a zero-degree phase shifted RF sinusoidal signal 510 to the first pulse width modulated signal generator 500. Furthermore the RF-local oscillator provides a 90-degree phase shifted RF sinusoidal signal 550 to the second pulse width modulated signal generator 505. The first 515 base-band pre-distortion element comprises a first 516, and a second 517 pre-distortion block. The second 555 base-band pre-distortion element comprises a first 556, and a second 557 pre-distortion block.

The first base-band pre-distortion element 515 receives a signal 525 representing the absolute value of the in-phase component of a base-band signal and provides a first pre-distorted signal, which is an altered version of the absolute value of the in-phase component of the base-band signal, to the negative input 522 of the first comparator 520. The zero-degree phase shifted RF sinusoidal signal 510 is input to the positive input 528 of the first comparator 520. The first comparator 520 provides a first comparator signal. The first XOR logical unit 540 is coupled to receive the first comparator signal and a signal 545 representing the sign of the in-phase component of a base-band signal, and provides a first binary pulse width modulated signal carrying the in-phase information of the base-band signal. The second base-band pre-distortion element 555 receives a signal 565 representing the absolute value of the quadrature component of a base-band signal and provides a second pre-distorted signal, which is an altered version of the absolute value of the quadrature component of the base-band signal, to the negative input 562 of the second comparator 560. The 90-degree phase shifted RF sinusoidal signal 550 is input to the positive input 568 of the second comparator 560. The second comparator 560 provides a second comparator signal. The second XOR logical unit 580 is coupled to receive the second comparator signal and a signal 585 representing the sign of the quadrature component of a base-band signal, and provides a second binary pulse width modulated signal carrying the quadrature information of the base-band signal.

In one embodiment of the invention the first pre-distortion blocks 516,556 carry out the absolute value to duty cycle conversion. In this embodiment the second pre-distortion blocks 517,557 carry out the duty cycle to comparator level conversion, the sign of this conversion being dependent on the sign of the In-phase and Quadrature components of the base-band signal.

Systems generating pulse width modulated signals by means of using other logical units, e.g. NXOR, are also envisaged.

In one embodiment of the invention the comparator-level produced by the base-band pre-distortion elements is related to the duty cycle of the signal amplified by the radio-frequency power amplifier. The band-pass filtering ensures that in essence only the first harmonic content, including its sidebands, of the binary signal is transmitted by the antenna. In general the amplitude, $A_g$ of the first-harmonic content of a binary signal having a duty cycle, $dc_g$ is given by equation (2)

$$A_g = dc_g \cdot \text{sin } c(\pi \cdot dc_g) = 1/\pi \cdot \sin(\pi \cdot dc_g) \tag{2}$$

In the following, the In-phase, I, and Quadrature, Q, components of the RF signal will be treated separately. Moreover the positive and the negative parts of these In-phase and Quadrature components will also be treated separately. This is imposed by the fact that the first-harmonic content of a binary PWM signal cannot be flipped in phase by applying some appropriate comparator level. Therefore four different cases will be considered in relation to the comparator levels required to be produced by the base-band pre-distortion elements.

The amplitude of the positive part of the In-phase component of the RF signal is represented by $I_p$ and can be defined as:

$$I_p = \begin{cases} I & \text{if } I > 0 \\ 0 & \text{if } I \leq 0 \end{cases}$$

Following equation (2) the amplitude of the positive part of the In-phase component of the RF signal can be written as in equation (2Ip).

$$I_p = dc_{I_p} \cdot \sin c(\pi \cdot dc_{I_p}) = 1/\pi \cdot \sin(\pi \cdot dc_{I_p}) \quad (2\text{Ip})$$

In the described embodiment the system requires the transmission of a positive I-component with an amplitude $I_p$, therefore the first comparator should deliver a binary signal having a duty cycle, $dc_{I_p}$, as indicated in equation (3Ip).

$$dc_{I_p} = 1/\pi \cdot \arcsin(\pi \cdot I_p) \quad (3\text{Ip})$$

A first pre-distortion block 216 of the first pre-distortion element 215 carries out the conversion from the required amplitude, $I_p$, of the binary PWM signal generated to a required duty cycle, $dc_{I_p}$, of the signal at the output of the first comparator.

The first comparator 220 compares the sinusoidal reference RF signal with the comparator level signal, $Cl_{I_p}$, provided by the first base-band pre-distortion element 215. Slicing a sinusoidal signal, having an amplitude of one, with a comparator level signal, $Cl_{I_p}$, produces a binary signal with duty cycle, $dc_{I_p}$, as indicated in equation (4Ip)

$$dc_{I_p} = \frac{1}{2} - \frac{\arcsin(Cl_{I_p})}{\pi} \quad (4\text{Ip})$$

In the described embodiment the system requires that the first comparator 220 should generate a binary signal having a duty cycle, dc, as indicated in equation (3Ip), therefore the second pre-distortion block 217 of the first pre-distortion element 215 should generate a comparator level, $Cl_{I_p}$, following equation (5Ip)

$$Cl_{I_p} = \sin\left(\pi \cdot \left(\frac{1}{2} - dc_{I_p}\right)\right) \quad (5\text{Ip})$$

The amplitude of the negative part of the In-phase component of the RF signal is represented by $I_n$ and can be defined as:

$$I_n = \begin{cases} -I & \text{if } I < 0 \\ 0 & \text{if } I \geq 0 \end{cases}$$

The negative part $I_n$ should correspond with an RF signal being 180 degrees out of phase compared to the positive part $I_p$ signal. Therefore the reference RF signal going to the comparator 240 taking care of the negative part $I_n$ signal needs to be 180 degrees phase shifted with respect to the reference signal going to the first comparator 220 taking care of the positive part $I_p$ signal Following the notation presented for the amplitude of the positive part of the In-phase component of the RF signal it is possible to reach similar expressions regarding the amplitude of the negative part of the In-phase component of the RF signal. The first pre-distortion block 236 of the second pre-distortion element 235 needs to carry out the conversion as given in equation (3In).

$$dc_{I_n} = 1/\pi \cdot \arcsin(\pi \cdot I_n) \quad (3\text{In})$$

And the second pre-distortion block 237 of the second pre-distortion element 235 should carry out the conversion as given in equation (5In).

$$Cl_{I_n} = \sin\left(\pi \cdot \left(\frac{1}{2} - dc_{I_n}\right)\right) \quad (5\text{In})$$

The Quadrature, Q, component of the RF signal is split in a positive part $Q_p$ and a negative part $Q_n$. The definitions of these signals are similar to those of the In-phase component:

$$Q_p = \begin{cases} Q & \text{if } Q > 0 \\ 0 & \text{if } Q \leq 0 \end{cases}$$

$$Q_n = \begin{cases} -Q & \text{if } Q < 0 \\ 0 & \text{if } Q \geq 0 \end{cases}$$

The positive part $Q_p$ signal and a negative part $Q_n$ signal correspond with RF signals with 90 degrees and 270 degrees phase shift respectively. Therefore the reference RF signals used for the comparators concerned, 260 and 280, are also 90 degrees and 270 degrees phase shifted respectively.

The first pre-distortion block 256 of the third pre-distortion element 255 needs to carry out the amplitude to duty cycle conversion as indicated in equation (3Qp).

$$dc_{Q_p} = 1/\pi \cdot \arcsin(\pi \cdot Q_p) \quad (3\text{Qp})$$

The first pre-distortion block 276 of the fourth pre-distortion element 275 needs to carry out the amplitude to duty cycle conversion as indicated in equation (3Qn).

$$dc_{Q_n} = 1/\pi \cdot \arcsin(\pi \cdot Q_n) \quad (3\text{Qn})$$

The second pre-distortion block 257 of the third pre-distortion element 255 needs to carry out the duty cycle to comparator level conversion as indicated in equation (5Qp).

$$Cl_{Q_p} = \sin\left(\pi \cdot \left(\frac{1}{2} - dc_{Q_p}\right)\right) \quad (5\text{Qp})$$

The second pre-distortion block 277 of the fourth pre-distortion element 275 needs to carry out the duty cycle to comparator level conversion as indicated in equation (5Qn).

$$Cl_{Q_n} = \sin\left(\pi \cdot \left(\frac{1}{2} - dc_{Q_n}\right)\right) \quad (5\text{Qn})$$

Figure 4D:
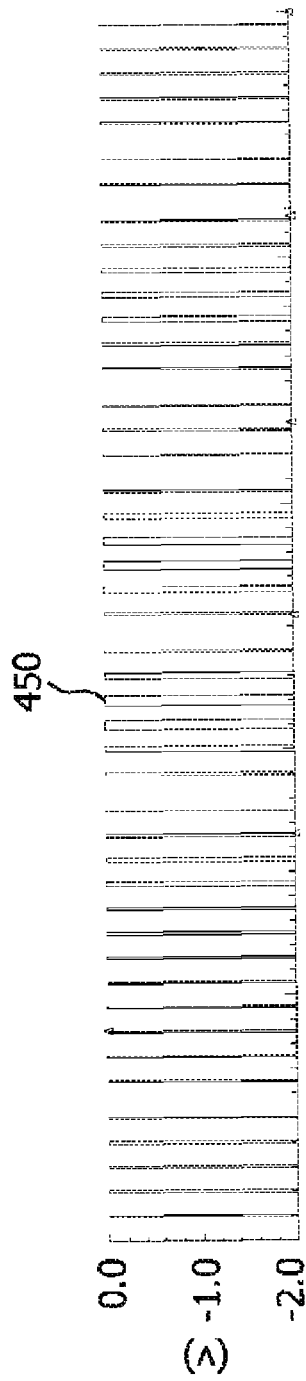
FIG. 4 is an example of the application of a Cartesian modulation system showing the characteristics of the different signals involved in the creation of an RF output signal modulated by a base-band signal via Cartesian modulation.
Figure 4E:
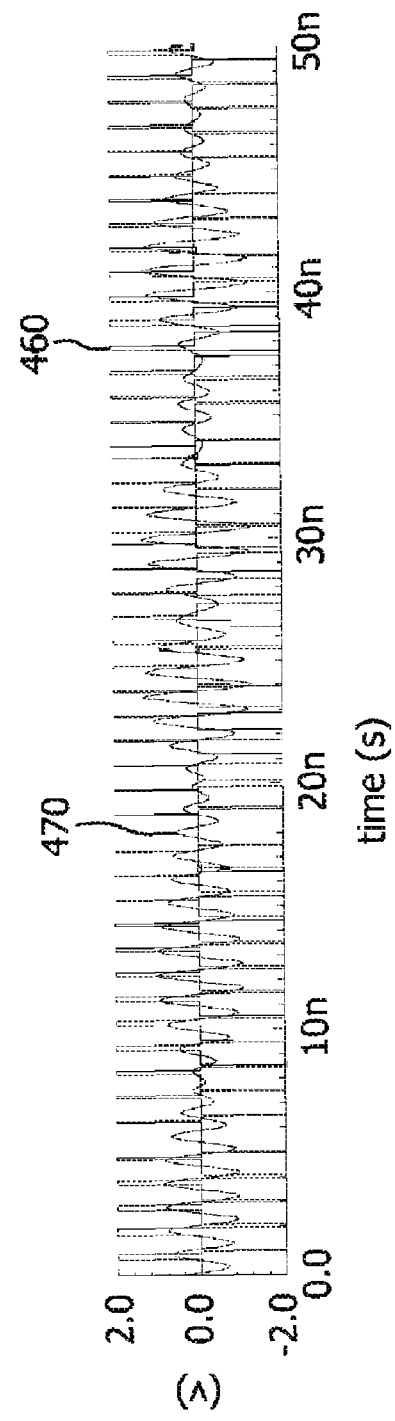

In FIG. 4, an example of the application of a Cartesian modulation system according to the previous embodiment is presented. The example showing the characteristics of the different signals involved in the creation of an RF output signal modulated by a base-band signal via Cartesian modulation. In FIG. 4a the In-phase component, 410, of a base-band modulated example signal and its positive part 405, $I_p$, are depicted as a function of time. In FIG. 4b the comparator level obtained from the first base-band pre-distortion element 430 and the RF reference signal 420 are shown. In FIG. 4c the output signal from the first comparator 440 related to the positive part of the In-phase component is shown. It can be observed that a signal different from zero is obtained only when the comparator level is lower than the RF signal. In FIG. 4d the pulse width modulated signal 450 obtained from the combination of the signals provided by the first and second comparators is depicted as a function of time. The resulting three-level pulse width modulated signal 460 can be observed in FIG. 4e. FIG. 4e also presents the sinusoidal radio frequency signal 470 obtained at the output of the band-pass filtering stage 295 characterized by in essence allowing transmission of the first-harmonic content including its sidebands.

In an alternative embodiment of the invention, flipping of the phase of the first-harmonic content of the binary PWM signals can be implemented with XOR gates. Every time the In-phase or Quadrature components change polarity, the phase is flipped with 180 degrees by the XOR gate. Since the polarity, or sign, of the In-phase and Quadrature components is taken care of this way, the pre-distortion/comparator units only have to take care of the absolute values of the I- and Q-component.

Apart from inverting or flipping the RF signal over 180 degrees the XOR gates also inverts the "DC-level" presence, in a quasi stationary approximation, at the output of the comparator. This means that an irregular square wave signal will be generated, which, with its harmonics, heavily pollutes the output spectra. To prevent this from happening, in the second pre-distortion blocks 517, 557 the comparator level is also inverted when the In-phase or the Quadrature components become negative.

The first pre-distortion block 516 of the first pre-distortion element 515 needs to carry out the absolute value to duty cycle conversion as indicated in equation (3I_abs).

$$dc_{|I|} = 1/\pi \cdot \arcsin(\pi \cdot |I|) \quad (3I\_abs)$$

The first pre-distortion block 556 of the second pre-distortion element 555 needs to carry out the absolute value to duty cycle conversion as indicated in equation (3Q_abs).

$$dc_{|Q|} = 1/\pi \cdot \arcsin(\pi \cdot |Q|) \quad (3Q\_abs)$$

The second pre-distortion block 517 of the first pre-distortion element 515 needs to carry out the duty cycle to comparator level conversion as indicated in equation (5I_abs).

$$Cl_{|I|} = \sin\left(\pi \cdot \left(\frac{1}{2} - dc_{|I|}\right)\right) \cdot \text{sign}(I) \quad (5I\_abs)$$

The second pre-distortion block 557 of the second pre-distortion element 555 needs to carry out the duty cycle to comparator level conversion as indicated in equation (5Q_abs).

$$Cl_{|Q|} = \sin\left(\pi \cdot \left(\frac{1}{2} - dc_{|Q|}\right)\right) \cdot \text{sign}(Q) \quad (5Q\_abs)$$

In another embodiment of the invention the reference radio-frequency signal is a nonlinearly distorted sinusoidal signal. In this embodiment the RF-oscillator may deliver a signal that can be represented by a non-linear transfer function of a pure sinusoidal signal, $f(\sin(\omega_c t+\phi(t)))$, wherein the function, f, represents the non-linear distortion transfer function. Slicing a non-linearly distorted sinusoidal signal, as given by the previous expression, with a comparator level signal, $Cl_g$, produces a binary signal with duty cycle, $dc_g$, as indicated in equation (6).

$$dc_g = \frac{1}{2} - \frac{1}{\pi} \cdot \arcsin(f^{inv}(Cl_g)) \quad (6)$$

wherein $f^{inv}$ represents the inverse function of the function, f.

Therefore the second pre-distortion block 217 of the first pre-distortion element 215 should generate a comparator level, Cl, following equation (7Ip).

$$Cl_{Ip} = f\left(\sin\left(\pi \cdot \left(\frac{1}{2} - dc_{Ip}\right)\right)\right) \quad (7Ip)$$

According to this embodiment pre-distortion blocks (237, 257, 277) of the second, third and fourth pre-distortion elements (235, 255, 275) should generate comparator levels following equations (7In), (7Qp) and (7Qn) respectively.

$$Cl_{In} = f\left(\sin\left(\pi \cdot \left(\frac{1}{2} - dc_{In}\right)\right)\right) \quad (7In)$$

$$Cl_{Qp} = f\left(\sin\left(\pi \cdot \left(\frac{1}{2} - dc_{Qp}\right)\right)\right) \quad (7Qp)$$

$$Cl_{Qn} = f\left(\sin\left(\pi \cdot \left(\frac{1}{2} - dc_{Qn}\right)\right)\right) \quad (7Qn)$$

An alternative embodiment of the invention can be considered, wherein flipping of the phase of the first-harmonic content of the binary PWM signals is implemented with XOR gates and the reference radio-frequency signal may be a nonlinearly distorted sinusoidal signal. In this embodiment and following previous notation, the second pre-distortion block 517 of the first pre-distortion element 515 should generate a comparator level, Cl, following equation (8I_abs).

$$Cl_{|I|} = f\left(\sin\left(\pi \cdot \left(\frac{1}{2} - dc_{|I|}\right)\right)\right) \cdot \text{sign}(I) \quad (8I\_abs)$$

The second pre-distortion block 557 of the second pre-distortion element 555 should generate a comparator level, Cl, following equation (8Q_abs).

$$Cl_{|Q|} = f\left(\sin\left(\pi \cdot \left(\frac{1}{2} - dc_{|Q|}\right)\right)\right) \cdot \text{sign}(Q) \quad (8Q\_abs)$$

In another embodiment of the invention the combination and amplification stage 290 is implemented comprising a plurality of power amplifiers, a plurality of quarter-lambda transmission lines and a combiner, a block diagram illustrating the elements of an example of this alternative implementation of the combination and amplification stage is shown in FIG. 6. In this embodiment the first pulse width modulated signal 624 obtained at the output of the first combiner 224 is amplified by a first power amplifier 610 providing a first amplified pulse width modulated signal. The second pulse width modulated signal 668 obtained at the output of the second combiner 268 is amplified by a second power amplifier 620 providing a second amplified pulse width modulated signal. The first and second amplifiers typically present similar characteristics. In this embodiment the first and second power amplifiers have low-ohmic outputs, and first 630 and second 640 quarter-lambda transmission lines are used to transform the voltage-source characteristic of the first and second power-amplifier output into a current-source characteristic, allowing for a simple connection of the transmission-line outputs in parallel at a combiner 650. The band-pass filter 670 and antenna 680 have the same characteristics as those described in the previous embodiments (295,298) and may be implemented in any of the ways described previously.

In another embodiment of the invention the base-band pre-distortion elements (215, 235, 255, 275) are adjusted in order to provide pulse width modulated signals at the outputs of the comparators with fundamental frequencies other than the RF-carrier frequency. This characteristic can be achieved by applying proper amplitude to duty cycle conversion within the first blocks (216, 236, 256, 276) of the base-band pre-distortion elements. Two different cases can be envisioned in this particular embodiment. The first case relates to the situation where the fundamental frequencies of the pulse width modulated signals at the output of the comparators are lower than the RF-carrier frequency, this case can be considered as a sub-sampling case. The second case relates to the situation where the fundamental frequencies of the pulse width modulated signal at the output of the comparators are higher than the RF-carrier frequency, this case can be considered as an over-sampling case.

The relation presented in equation (2) relating the amplitude, $A_g$ of the first-harmonic content of a given binary signal with the duty cycle, $dc_g$, can be generalized to the integer sub-sampling or integer over-sampling cases as shown in equation (9)

$$A_g = dc_g \cdot \mathrm{sinc}(\pi \cdot N \cdot dc_g) = \frac{\sin(\pi \cdot N \cdot dc_g)}{\pi \cdot N} \tag{9}$$

wherein $N \in \{2, 3, 4 \ldots\}$ in the integer sub-sampling case
$N \in \{\frac{1}{2}, \frac{1}{3}, \frac{1}{4}, \ldots\}$ in the integer over-sampling case.

In the described embodiment the system requires the transmission of a positive I-component with an amplitude $I_p$, therefore the first comparator should deliver a binary signal having a duty cycle, $dc_{I_p}$, as indicated in equation (10Ip).

$$dc_{I_p} = \frac{\arcsin(\pi \cdot N \cdot I_p)}{\pi \cdot N} \tag{10Ip}$$

According to this embodiment first pre-distortion blocks (236, 256, 276) of the second, third and fourth pre-distortion elements (235, 255, 275) should generate comparator levels following equations (10In), (10Qp) and (10Qn) respectively.

$$dc_{I_n} = \frac{\arcsin(\pi \cdot N \cdot I_n)}{\pi \cdot N} \tag{10In}$$

$$dc_{Q_p} = \frac{\arcsin(\pi \cdot N \cdot Q_p)}{\pi \cdot N} \tag{10Qp}$$

$$dc_{Q_n} = \frac{\arcsin(\pi \cdot N \cdot Q_n)}{\pi \cdot N} \tag{10Qn}$$

An alternative embodiment of the invention can be considered, wherein flipping of the phase of the first-harmonic content of the binary PWM signals is implemented with XOR gates and the pulse width modulated signals at the outputs of the comparators have fundamental frequencies other than the RF-carrier frequency. In this embodiment and following previous notation, the second pre-distortion block 517 of the first pre-distortion element 515 should generate a comparator level, Cl, following equation (11I_abs)

$$dc_{|I|} = \frac{\arcsin(\pi \cdot N \cdot |I|)}{\pi \cdot N} \tag{11I\_abs}$$

The second pre-distortion block 557 of the second pre-distortion element 555 should generate a comparator level, Cl, following equation (11Q_abs)

$$dc_{|Q|} = \frac{\arcsin(\pi \cdot N \cdot |Q|)}{\pi \cdot N} \tag{11Q\_abs}$$

The invention may be implemented as a combination of the embodiments presented above. The system for achieving Cartesian modulation may consist of a first binary pulse width modulated signal generator 200 implemented following the embodiment where two comparators are included and a second pulse width modulated signal generator 505 implemented following the embodiment where a single comparator and a logical unit are included. The system for achieving Cartesian modulation may also consist of a first binary pulse width modulated signal generator 500 implemented following the embodiment where a single comparator and a logical unit are included and a second pulse width modulated signal generator 205 implemented following the embodiment where two comparators are included.

The invention can be implemented in any suitable form including hardware, software, firmware or any combination of these. The invention can be implemented as computer software running on one or more data processors and/or digital signal processors. The elements and components of an embodiment of the invention may be physically, functionally and logically implemented in any suitable way. Indeed, the functionality may be implemented in a single unit, in a plurality of units or as part of other functional units. As such, the invention may be implemented in a single unit, or may be physically and functionally distributed between different units and processors.

Although the present invention has been described in connection with preferred embodiments, it is not intended to be limited to the specific form set forth herein. Rather, the scope of the present invention is limited only by the accompanying claims.

In this section, certain specific details of the disclosed embodiment are set forth for purposes of explanation rather than limitation, so as to provide a clear and thorough understanding of the present invention. However, it should be understood readily by those skilled in this art, that the present invention may be practiced in other embodiments which do not conform exactly to the details set forth herein, without departing significantly from the spirit and scope of this disclosure. Further, in this context, and for the purposes of brevity and clarity, detailed descriptions of well-known apparatus, circuits and methodologies have been omitted so as to avoid unnecessary detail and possible confusion.

Reference signs are included in the claims, however the inclusion of the reference signs is only for clarity reasons and should not be construed as limiting the scope of the claims.

The invention claimed is:

1. A Cartesian modulation system for producing an RF output signal, containing an RF carrier and modulated by a base-band signal, the system comprising: a first binary pulse width modulated signal generator for receiving signals related to the in-phase component of a base-band signal comprising at least one base-band pre-distortion element and at least one signal comparator, and producing a first binary pulse width modulated signal carrying the in-phase information of the base-band signal; a second binary pulse width modulated signal generator for receiving signals related to the quadrature component of a base-band signal, comprising at least one base-band pre-distortion element and at least one signal comparator, and producing a second binary pulse width modulated signal carrying the quadrature information of the base-band signal; and a combination and amplification stage for combining the first binary pulse width modulated signal and second binary pulse width modulated signal and providing an amplified three-level pulse width modulated radio frequency signal carrying the in-phase and quadrature components of the base-band signal.

2. A system according to claim 1, wherein the first binary pulse width modulated signal generator comprises: a first comparator for comparing a reference radio-frequency signal with a first base-band pre-distorted signal, the first comparator producing a first comparator signal, wherein the first base-band pre-distorted signal is related to the positive part of the in-phase component of the base-band signal; a second comparator for comparing a 180 degree phase shifted version of the reference radio-frequency signal with a second base-band pre-distorted signal, the second comparator producing a second comparator signal, wherein the second base-band pre-distorted signal is related to the negative part of the in-phase component of the base-band signal; and an in-phase combination stage for adding the first comparator signal to the second comparator signal for producing the first binary pulse width modulated signal carrying the in-phase information of the base-band signal.

3. A system according to claim 1, wherein the first binary pulse width modulated signal generator comprises: a comparator for comparing a reference radio-frequency signal with a base-band pre-distorted signal, the comparator producing a comparator signal, wherein the base-band pre-distorted signal is related to the absolute value of the in-phase component of the base-band signal; and a logic unit for receiving the comparator signal and the sign of the in-phase component of the base-band signal, and producing the first binary pulse width modulated signal carrying the in-phase information of the base-band signal.

4. A system according to claim 1, wherein the second binary pulse width modulated signal generator comprises: a first comparator for comparing a 90 degree phase shifted version of a reference radio-frequency signal with a first base-band pre-distorted signal, the first comparator producing a first comparator signal, wherein the first base-band pre-distorted signal is related to the positive part of the quadrature component of the base-band signal; a second comparator for comparing a 270 degree phase shifted version of the reference radio-frequency signal with a second base-band pre-distorted signal, the second comparator producing a second comparator signal, wherein the second base-band pre-distorted signal is related to the negative part of the quadrature component of the base-band signal; and a quadrature combination stage for adding the first comparator signal to the second comparator signal for producing the second binary pulse width modulated signal carrying the quadrature information of the base-band signal.

5. A system according to claim 1, wherein the second binary pulse width modulated signal generator comprises:
  a comparator for comparing a 90 degree phase shifted version of a reference radio-frequency signal with a base-band pre-distorted signal, the comparator producing a comparator signal, wherein the base-band pre-distorted signal is related to the absolute value of the quadrature component of the base-band signal; and a logic unit for receiving the comparator signal and the sign of the quadrature component of the base-band signal, and producing the second binary pulse width modulated signal carrying the quadrature information of the base-band signal.

6. A system according to claim 1, wherein the first binary pulse width modulated signal generator comprises: a first comparator for comparing a reference radio-frequency signal with a first base-band pre-distorted signal, the first comparator producing a first comparator signal, wherein the first base-band pre-distorted signal is related to the positive part of the in-phase component of the base-band signal; a second comparator for comparing a 180 degree phase shifted version of the reference radio-frequency signal with a second base-band pre-distorted signal, the second comparator producing a second comparator signal, wherein the second base-band pre-distorted signal is related to the negative part of the in-phase component of the base-band signal; and an in-phase combination stage for adding the first comparator signal to the second comparator signal for producing the first binary pulse width modulated signal carrying the in-phase information of the base-band signal; and
  wherein the second binary pulse width modulated signal generator comprises: a third comparator for comparing a 90 degree phase shifted version of the reference radio-frequency signal with a third base-band pre-distorted signal, the third comparator producing a third comparator signal, wherein the third base-band pre-distorted signal is related to the positive part of the quadrature component of the base-band signal; a fourth comparator for comparing a 270 degree phase shifted version of the reference radio-frequency signal with a fourth base-band pre-distorted signal, the fourth comparator producing a fourth comparator signal, wherein the fourth base-band pre-distorted signal is related to the negative part of the quadrature component of the base-band signal; and a quadrature combination stage for adding the third comparator signal to the fourth comparator signal for producing the second binary pulse width modulated signal carrying the quadrature information of the base-band signal.

7. A system according to claim 1, wherein the first binary pulse width modulated signal generator comprises: a first comparator for comparing a reference radio-frequency signal with a first base-band pre-distorted signal, the first comparator producing a first comparator signal, wherein the first base-band pre-distorted signal is related to the positive part of the in-phase component of the base-band signal; a second comparator for comparing a 180 degree phase shifted version of the reference radio-frequency signal with a second base-band pre-distorted signal, the second comparator producing a second comparator signal, wherein the second base-band pre-distorted signal is related to the negative part of the in-phase component of the base-band signal; and an in-phase combination stage for adding the first comparator signal to the second comparator signal for producing the first binary pulse width modulated signal carrying the in-phase information of the base-band signal; and
  wherein the second binary pulse width modulated signal generator comprises: a third comparator for comparing a 90 degree phase shifted version of the reference radio-frequency signal with a third base-band pre-distorted signal, the third comparator producing a third comparator signal, wherein the third base-band pre-distorted signal is related to the absolute value of the quadrature component of the base-band signal; and a logic unit for receiving the third comparator signal and the sign of the quadrature component of the base-band signal, and producing the second binary pulse width modulated signal carrying the quadrature information of the base-band signal.

8. A system according to claim 1, wherein the first binary pulse width modulated signal generator comprises: a first comparator for comparing a reference radio-frequency signal with a first base-band pre-distorted signal, the comparator producing a first comparator signal, wherein the first base-band pre-distorted signal is related to the absolute value of the in-phase component of the base-band signal; and a logic unit for receiving the first comparator signal and the sign of the in-phase component of the base-band signal, and producing the first binary pulse width modulated signal carrying the in-phase information of the base-band signal; and wherein the second binary pulse width modulated signal generator comprises: a second comparator for comparing a 90 degree phase shifted version of the reference radio-frequency signal with a second base-band pre-distorted signal, the second comparator producing a second comparator signal, wherein the second base-band pre-distorted signal is related to the positive part of the quadrature component of the base-band signal; a third comparator for comparing a 270 degree phase shifted version of the reference radio-frequency signal with a third base-band pre-distorted signal, the third comparator producing a third comparator signal, wherein the third base-band pre-distorted signal is related to the negative part of the quadrature component of the base-band signal; and a quadrature combination stage for adding the second comparator signal to the third comparator signal producing the second binary pulse width modulated signal carrying the quadrature information of the base-band signal.

9. A system according to claim 1, wherein the first binary pulse width modulated signal generator comprises: a first comparator for comparing a reference radio-frequency signal with a first base-band pre-distorted signal, the comparator producing a first comparator signal, wherein the first base-band pre-distorted signal is related to the absolute value of the in-phase component of the base-band signal; and a first logic unit for receiving the first comparator signal and the sign of the in-phase component of the base-band signal, and producing the first binary pulse width modulated signal carrying the in-phase information of the base-band signal; and wherein the second binary pulse width modulated signal generator comprises: a second comparator for comparing a 90 degree phase shifted version of the reference radio-frequency signal with a second base-band pre-distorted signal, the second comparator producing a second comparator signal, wherein the second base-band pre-distorted signal is related to the absolute value of the quadrature component of the base-band signal; and a second logic unit for receiving the second comparator signal and the sign of the quadrature component of the base-band signal, and producing the second binary pulse width modulated signal carrying the quadrature information of the base-band signal.

10. A system according to claim 1, wherein the combination and amplification stage comprises a single power amplifier containing a decoder and a three-level switching output stage.

11. A system according to claim 1, wherein the combination and amplification stage comprises a plurality of power amplifiers, a plurality of quarter-lambda transmission lines and a combiner.

12. The system according to claim 1, further comprising a band-pass filtering stage for filtering the amplified version of the pulse width modulated signal.

13. The system according to claim 12, wherein the band-pass filtering stage is used for limit the transmitted signal essentially to its first -harmonic and corresponding sidebands.

14. The system according to claim 1, wherein the fundamental frequencies of the amplified three-level pulse width modulated radio frequency signal comprise the RF-carrier frequency.

15. The system according to claim 1, wherein the fundamental frequencies of the amplified three-level pulse width modulated radio frequency signal are other than the RF-carrier frequency.

16. A transmitter comprising a modulation system according to claim 1.

17. A method for generating an RF output signal modulated by a base-band signal, comprising the steps of: producing a first binary pulse width modulated signal carrying the in-phase information of the base-band signal, based on at least a first base-band pre-distortion element and signals related to the in-phase component of a base-band signal, producing a second binary pulse width modulated signal carrying the quadrature information of the base-band signal, based on at least a second base-band pre-distortion element and signals related to the quadrature component of a base-band signal, combining the first binary pulse width modulated radio frequency signal and the second binary pulse width modulated radio frequency signal in order to provide an amplified three-level pulse width modulated radio frequency signal carrying the in-phase and quadrature components of the base-band signal.

18. A computer readable code stored on a non-transitory computer readable medium comprising instructions for causing a microprocessor to perform the method of claim 17.

* * * * *